United States Patent
Yang et al.

(10) Patent No.: US 10,069,518 B2
(45) Date of Patent: Sep. 4, 2018

(54) UNEVEN BIT DISTRIBUTIONS FOR ENCODER PARSING

(71) Applicant: QUALCOMM Incorporated, San Diego, CA (US)

(72) Inventors: Lin Yang, San Diego, CA (US); Bin Tian, San Diego, CA (US); Jialing Li Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 216 days.

(21) Appl. No.: 14/920,584

(22) Filed: Oct. 22, 2015

(65) Prior Publication Data

US 2016/0119002 A1    Apr. 28, 2016

Related U.S. Application Data (60) Provisional application No. 62/068,393, filed on Oct. 24, 2014.

(51) Int. Cl.
*H03M 13/35* (2006.01)
*H04L 1/00* (2006.01)

(52) U.S. Cl.
CPC ........ *H03M 13/353* (2013.01); *H04L 1/0015* (2013.01); *H04L 1/0041* (2013.01); *H04L 1/0057* (2013.01)

(58) Field of Classification Search
CPC .. H03M 13/353; H03M 7/46; H03M 13/2906; H04N 19/91; H04N 19/174; H04L 1/0057; H04L 1/0015; H04L 1/0041; H04L 1/00; H04L 1/0075; H04L 1/0083; H04W 84/12
See application file for complete search history.

(56) References Cited

U.S. PATENT DOCUMENTS

| | | | | |
|---|---|---|---|---|
| 8,907,823 B2* | 12/2014 | Marpe | ................ | H03M 7/4006 341/107 |
| 2007/0143655 A1 | 6/2007 | Niu et al. | | |
| 2013/0258955 A1* | 10/2013 | Baik | ................... | H04L 1/0016 370/329 |
| 2013/0315264 A1 | 11/2013 | Srinivasa et al. | | |
| 2015/0271701 A1* | 9/2015 | Baik | ................... | H04L 27/2602 370/474 |

OTHER PUBLICATIONS

International Search Report and Written Opinion—PCT/US2015/057244—ISA/EPO—dated Jan. 29, 2016.

* cited by examiner

*Primary Examiner* — Phung M Chung
(74) *Attorney, Agent, or Firm* — Arent Fox, LLP and Qualcomm (57) ABSTRACT

A method, an apparatus, and a computer-readable medium for wireless communication are provided. In one aspect, an apparatus is configured determine a number of symbols in a data field. The apparatus is configured to distribute a first number of data bits to each encoder in a subset of encoders in a set of encoders based on the determined number of symbols. The apparatus is configured to distribute a second number of data bits to a last encoder in the set of encoders based on the determined number of symbols. The apparatus is configured to transmit data to a second wireless device. The data is encoded based on the distributed first and second number of data bits.

26 Claims, 6 Drawing Sheets

UNEVEN BIT DISTRIBUTIONS FOR ENCODER PARSING

CROSS-REFERENCE TO RELATED APPLICATION(S)

This application claims the benefit of U.S. Provisional Application Ser. No. 62/068,393, entitled "Uneven Bit Distributions for Encoder Parsing" and filed on Oct. 24, 2014, which is expressly incorporated by reference herein in its entirety.

BACKGROUND

Field

The present disclosure relates generally to communication systems, and more particularly, to supporting uneven bit distributions for encoder parsing.

Background

In many telecommunication systems, communications networks are used to exchange messages among several interacting spatially-separated devices. Networks may be classified according to geographic scope, which could be, for example, a metropolitan area, a local area, or a personal area. Such networks would be designated respectively as a wide area network (WAN), metropolitan area network (MAN), local area network (LAN), wireless local area network (WLAN), or personal area network (PAN). Networks also differ according to the switching/routing technique used to interconnect the various network nodes and devices (e.g., circuit switching vs. packet switching), the type of physical media employed for transmission (e.g., wired vs. wireless), and the set of communication protocols used (e.g., Internet protocol suite, Synchronous Optical Networking (SONET), Ethernet, etc.).

Wireless networks are often preferred when the network elements are mobile and thus have dynamic connectivity needs, or if the network architecture is formed in an ad hoc, rather than fixed, topology. Wireless networks employ intangible physical media in an unguided propagation mode using electromagnetic waves in the radio, microwave, infra-red, optical, etc., frequency bands. Wireless networks advantageously facilitate user mobility and rapid field deployment when compared to fixed wired networks.

SUMMARY

The systems, methods, computer program products, and devices of the invention each have several aspects, no single one of which is solely responsible for the invention's desirable attributes. Without limiting the scope of this invention as expressed by the claims which follow, some features will now be discussed briefly. After considering this discussion, and particularly after reading the section entitled "Detailed Description," one will understand how the features of this invention provide advantages for devices in a wireless network.

One aspect of this disclosure provides a wireless device (e.g., an access point or a station) for wireless communication. The wireless device is configured to determine a number of symbols in a data field. The wireless device is configured to distribute a first number of data bits to each encoder in a subset of encoders in a set of encoders based on the determined number of symbols. The wireless device is configured to distribute a second number of data bits to a last encoder in the set of encoders based on the determined number of symbols. The wireless device is configured to transmit data to a second wireless device. The data is encoded based on the distributed first number of data bits to each encoder in the subset of encoders and the distributed second number of data bits to the last encoder in the set of encoders.

DETAILED DESCRIPTION

Various aspects of the novel systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, computer program products, and methods disclosed herein, whether implemented independently of, or combined with, any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Popular wireless network technologies may include various types of WLANs. A WLAN may be used to interconnect nearby devices together, employing widely used networking protocols. The various aspects described herein may apply to any communication standard, such as a wireless protocol.

In some aspects, wireless signals may be transmitted according to an 802.11 protocol using orthogonal frequency-division multiplexing (OFDM), direct-sequence spread spectrum (DSSS) communications, a combination of OFDM and DSSS communications, or other schemes. Implementations of the 802.11 protocol may be used for sensors, metering, and smart grid networks. Advantageously, aspects of certain devices implementing the 802.11 protocol may consume less power than devices implementing other wireless protocols, and/or may be used to transmit wireless signals across a relatively long range, for example about one kilometer or longer.

In some implementations, a WLAN includes various devices which are the components that access the wireless network. For example, there may be two types of devices: access points (APs) and clients (also referred to as stations or "STAs"). In general, an AP may serve as a hub or base station for the WLAN and a STA serves as a user of the WLAN. For example, a STA may be a laptop computer, a personal digital assistant (PDA), a mobile phone, etc. In an example, a STA connects to an AP via a Wi-Fi (e.g., IEEE 802.11 protocol) compliant wireless link to obtain general connectivity to the Internet or to other wide area networks. In some implementations a STA may also be used as an AP.

An access point may also comprise, be implemented as, or known as a NodeB, Radio Network Controller (RNC), eNodeB, Base Station Controller (BSC), Base Transceiver Station (BTS), Base Station (BS), Transceiver Function (TF), Radio Router, Radio Transceiver, connection point, or some other terminology.

A station may also comprise, be implemented as, or known as an access terminal (AT), a subscriber station, a subscriber unit, a mobile station, a remote station, a remote terminal, a user terminal, a user agent, a user device, a user equipment, or some other terminology. In some implementations, a station may comprise a cellular telephone, a cordless telephone, a Session Initiation Protocol (SIP) phone, a wireless local loop (WLL) station, a personal digital assistant (PDA), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

In an aspect, MIMO schemes may be used for wide area WLAN (e.g., Wi-Fi) connectivity. MIMO exploits a radiowave characteristic called multipath. In multipath, transmitted data may bounce off objects (e.g., walls, doors, furniture), reaching the receiving antenna multiple times through different routes and at different times. A WLAN device that employs MIMO will split a data stream into multiple parts, called spatial streams (or multi-streams), and transmit each spatial stream through separate antennas to corresponding antennas on a receiving WLAN device.

The term "associate," or "association," or any variant thereof should be given the broadest meaning possible within the context of the present disclosure. By way of example, when a first apparatus associates with a second apparatus, it should be understood that the two apparatuses may be directly associated or intermediate apparatuses may be present. For purposes of brevity, the process for establishing an association between two apparatuses will be described using a handshake protocol that requires an "association request" by one of the apparatus followed by an "association response" by the other apparatus. It will be understood by those skilled in the art that the handshake protocol may require other signaling, such as by way of example, signaling to provide authentication.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. In addition, a phrase referring to "at least one of" a list of items refers to any combination of those items, including single members. As an example, "at least one of: A, B, or C" is intended to cover: A, or B, or C, or any combination thereof (e.g., A-B, A-C, B-C, and A-B-C).

As discussed above, certain devices described herein may implement the 802.11 standard, for example. Such devices, whether used as a STA or AP or other device, may be used for smart metering or in a smart grid network. Such devices may provide sensor applications or be used in home automation. The devices may instead or in addition be used in a healthcare context, for example for personal healthcare. They may also be used for surveillance, to enable extended-range Internet connectivity (e.g. for use with hotspots), or to implement machine-to-machine communications.

Figure 1:
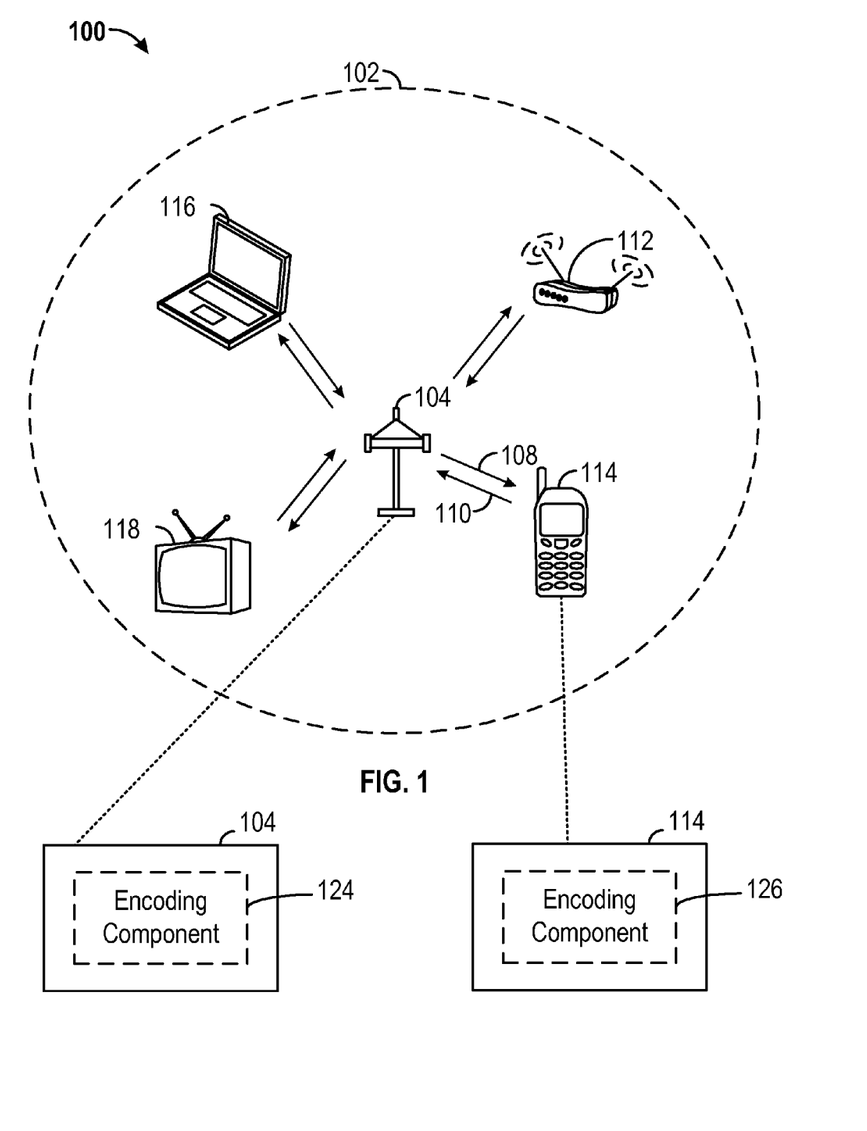
FIG. 1 shows an example wireless communication system in which aspects of the present disclosure may be employed.

FIG. 1 shows an example wireless communication system 100 in which aspects of the present disclosure may be employed. The wireless communication system 100 may operate pursuant to a wireless standard, for example the 802.11 standard. The wireless communication system 100 may include an AP 104, which communicates with STAs (e.g., STAs 112, 114, 116, and 118).

A variety of processes and methods may be used for transmissions in the wireless communication system 100 between the AP 104 and the STAs. For example, signals may be sent and received between the AP 104 and the STAs in accordance with OFDM/orthogonal frequency-division multiple access (OFDMA) techniques. If this is the case, the wireless communication system 100 may be referred to as an OFDM/OFDMA system. Alternatively, signals may be sent and received between the AP 104 and the STAs in accordance with CDMA techniques. If this is the case, the wireless communication system 100 may be referred to as a CDMA system.

A communication link that facilitates transmission from the AP 104 to one or more of the STAs may be referred to as a downlink (DL) 108, and a communication link that facilitates transmission from one or more of the STAs to the AP 104 may be referred to as an uplink (UL) 110. Alternatively, a downlink 108 may be referred to as a forward link or a forward channel, and an uplink 110 may be referred to as a reverse link or a reverse channel. In some aspects, DL communications may include unicast or multicast traffic indications.

The AP 104 may suppress adjacent channel interference (ACI) in some aspects so that the AP 104 may receive UL communications on more than one channel simultaneously without causing significant analog-to-digital conversion (ADC) clipping noise. The AP 104 may improve suppression of ACI, for example, by having separate finite impulse response (FIR) filters for each channel or having a longer ADC backoff period with increased bit widths.

The AP 104 may act as a base station and provide wireless communication coverage in a basic service area (BSA) 102. A BSA (e.g., the BSA 102) is the coverage area of an AP (e.g., the AP 104). The AP 104 along with the STAs associated with the AP 104 and that use the AP 104 for communication may be referred to as a basic service set (BSS). It should be noted that the wireless communication system 100 may not have a central AP (e.g., AP 104), but rather may function as a peer-to-peer network between the STAs. Accordingly, the functions of the AP 104 described herein may alternatively be performed by one or more of the STAs.

The AP 104 may transmit on one or more channels (e.g., multiple narrowband channels, each channel including a frequency bandwidth) a beacon signal (or simply a "beacon"), via a communication link such as the downlink 108, to other nodes (STAs) of the wireless communication system 100, which may help the other nodes (STAs) to synchronize their timing with the AP 104, or which may provide other information or functionality. Such beacons may be transmitted periodically. In one aspect, the period between successive transmissions may be referred to as a superframe. Transmission of a beacon may be divided into a number of groups or intervals. In one aspect, the beacon may include, but is not limited to, such information as timestamp information to set a common clock, a peer-to-peer network identifier, a device identifier, capability information, a superframe duration, transmission direction information, reception direction information, a neighbor list, and/or an extended neighbor list, some of which are described in additional detail below. Thus, a beacon may include information that is both common (e.g., shared) amongst several devices and specific to a given device.

In some aspects, a STA (e.g., STA 114) may be required to associate with the AP 104 in order to send communications to and/or to receive communications from the AP 104. In one aspect, information for associating is included in a beacon broadcast by the AP 104. To receive such a beacon, the STA 114 may, for example, perform a broad coverage search over a coverage region. A search may also be performed by the STA 114 by sweeping a coverage region in a lighthouse fashion, for example. After receiving the information for associating, the STA 114 may transmit a reference signal, such as an association probe or request, to the AP 104. In some aspects, the AP 104 may use backhaul services, for example, to communicate with a larger network, such as the Internet or a public switched telephone network (PSTN).

In an aspect, the AP 104 may include one or more components for performing various functions. For example, the AP 104 may include an encoding component 124 configured to determine a number of symbols in a data field. The encoding component 124 may be configured to distribute a first number of data bits to each encoder in a subset of encoders in a set of encoders based on the determined number of symbols. The encoding component 124 may be configured to distribute a second number of data bits to a last encoder in the set of encoders based on the determined number of symbols. The encoding component 124 may be configured to transmit data to a second wireless device, and the data may be encoded based on the distributed first number of data bits to each encoder in the subset of encoders and the distributed second number of data bits to the last encoder in the set of encoders.

In another aspect, the STA 114 may include one or more components for performing various functions. For example, the STA 114 may include an encoding component 126 configured to determine a number of symbols in a data field. The encoding component 126 may be configured to distribute a first number of data bits to each encoder in a subset of encoders in a set of encoders based on the determined number of symbols. The encoding component 126 may be configured to distribute a second number of data bits to a last encoder in the set of encoders based on the determined number of symbols. The encoding component 126 may be configured to transmit data to a second wireless device, and the data may be encoded based on the distributed first number of data bits to each encoder in the subset of encoders and the distributed second number of data bits to the last encoder in the set of encoders.

In wireless communications (e.g., in a Wi-Fi network), wireless devices may encode data using one or more encoders (e.g., binary convolution code (BCC) encoders) before transmitting the data. For example, encoders may be used in devices compliant with present and future IEEE 802.11 standards. In some instances, a wireless device may utilize multiple encoders to support a particular transmission bandwidth (e.g., 1 gigabits per second (Gbps)). In these instances, data bits for transmission may be scrambled and then evenly distributed among the encoders for encoding. For example, assuming there are a number of encoders, $N_{ES}$, every consecutive block of $N_{ES}$ bits may be divided among the $N_{ES}$ encoders in a round robin fashion (e.g., 1 or more bits assigned per encoder in one cycle). To ensure that no bits are left over and that all encoders have the same number of bits for encoding, the overall number of bits after padding may be divided evenly such that each encoder of the $N_{ES}$ encoders has an equal number of allocated bits. In some cases, however, the number of data bits cannot be evenly divided amongst encoders at a given modulation and coding scheme (MCS) index and bandwidth. In such cases, MCS indices that result in an uneven distribution of bits to encoders may be disallowed. This reduces the number of MCS indices that may be used.

An MCS index may be disallowed for a given bandwidth and number of spatial streams, $N_{SS}$, if the MCS index does not pass the MCS exclusion test, which may be based on the following two expressions:

$$\begin{cases} \dfrac{N_{CBPS}}{N_{ES}} \\ \dfrac{N_{DBPS}}{N_{ES}} \end{cases}$$

That is, if either expression, $$\dfrac{N_{CBPS}}{N_{ES}} \text{ or } \dfrac{N_{DBPS}}{N_{ES}}$$

in the MCS exclusion test results in a non-integer value, the MCS index may be disallowed. $N_{CBPS}$ represents the number of coded bits per symbol, $N_{DBPS}$ represents the number of data bits per symbol, and $N_{ES}$ represents the number of encoders. If either of the above expressions are non-integers, this indicates that all of the encoders in the set of multiple encoders may not receive or be assigned the same number of data bits. The chances of the above expressions being non-integer increases when the number of encoders is greater than 1. In the above expressions, $N_{DBPS}$ may be determined by Eq. 1:

$$N_{DBPS} = N_{CBPS} \times R$$

In Eq. 1, R represents the MCS code rate (e.g., ½) and is associated with an MCS index. $N_{CBPS}$ may be determined by Eq. 2:

$$N_{CBPS} = N_{SD} \times N_{BPSCS}$$

In Eq. 2, $N_{SD}$ represents the number of data subcarriers in a symbol and $N_{BPSCS}$ represents the number of bits per single subcarrier for each spatial stream. For example, if there are 52 data subcarriers in a symbol and 2 bits per data subcarrier, then there may be 104 coded bits per symbol. Assuming an MCS code rate of ½, the number of data bits per symbol may be 52 in this example. $N_{ES}$ may be determined by Eq. 3:

$$N_{ES} = \left\lceil \frac{TotalDataRate}{EncoderDataRate} \right\rceil$$

The symbol $\lceil x \rceil$ is ceiling function that denotes the smallest integer greater than or equal to x. The TotalDataRate represents the data rate of the transmission, which may be determined by $$\frac{N_{DBPS}}{T_{sym}},$$

where $T_{sym}$ is a symbol duration. The EncoderDataRate represents the maximum data rate per encoder (e.g., the maximum data rate that the encoder may support), and may be determined based on the standard to which the wireless device is compliant. For example, in IEEE 802.11n, the maximum encoder data rate (or data rate per encoder) may be 360 megabits per second (Mbps). In IEEE 802.11ac, the maximum encoder data rate may be 600 Mbps. In an aspect, encoder data rates may be limited by the speed of decoders, and therefore, the maximum encoder data rate may depend on the maximum decoder rate. Because each encoder has a maximum encoder rate, in order to support higher data transmission rates, wireless devices may use multiple encoders. In an aspect, the MCS exclusion test is used to make sure that the puncture patterns may remain consistent between OFDM symbols and to avoid the need for extra padding symbols after puncturing/rate-matching.

In an example, assuming data bits are modulated using quadrature phase-shift keying (QPSK) modulation, then $N_{BPSCS}=2$. Assuming that the number of data subcarriers in a symbol, $N_{BPSCS}$, is 52 in a 20 MHz symbol, then the number of coded bits per symbol, $N_{CBPS}$, is equal to 104. Assuming R is equal to ½, the number of data bits per symbol, $N_{DPBS}$, is equal to 52. In this example, if $N_{ES}=4$, then $$\frac{N_{CBPS}}{N_{ES}}$$

and $$\frac{N_{DBPS}}{N_{ES}}$$

would be integer values (26 and 13, respectively), but if $N_{ES}=3$, then $$\frac{N_{CBPS}}{N_{ES}}$$

and $$\frac{N_{DBPS}}{N_{ES}}$$

would be not be integer values and a different MCS index may be needed. Any MCS index that would result in a non-integer value for expressions $$\frac{N_{CBPS}}{N_{ES}}$$

and $$\frac{N_{DBPS}}{N_{ES}}$$

may be excluded.

In an aspect, the expression $$\frac{N_{CBPS}}{N_{ES}},$$

$N_{CBPS}$ may often be an integer because $N_{SD}$ and $N_{BPSCS}$ may typically be integer values. $N_{DBPS}$ may be less likely than $N_{CBPS}$ to be an integer because the value of $N_{DBPS}$ depends on (or is a function of) R, which may be a non-integer (e.g., ½, ¾). Further, even if $N_{DBPS}$ is an integer, $$\frac{N_{DBPS}}{N_{ES}}$$

may be a non-integer when $N_{ES}$ is greater than 1. As such, even bit distribution for encoder parsing increases the possibility that for a certain $N_{SD}$, certain MCS indices may be excluded.

Additionally, in OFDMA transmissions, a user may be assigned k resource blocks (RBs), and each RB may have a different (or same) number of data subcarriers such that each RB may have a number of data bits per symbol. For example, resource block 1 may have $N_{DBPS,1}$ data bits per symbol, resource block 2 may have $N_{DBPS,2}$ data bits per symbol, through resource block k, which may have $N_{DBPS,k}$ data bits per symbol. Even if the number of data bits per symbol, within RBs (or symbols) 1, 2, . . . , k are integers and the expressions, $$\frac{N_{CBPS}}{N_{ES}}$$

and $$\frac{N_{DBPS}}{N_{ES}},$$

for each RB, are both integers, certain MCS indices may still be excluded. For example, assume each user uses joint encoding for all RBs. Joint encoding may refer to the scenario in which each user uses the same encoder (or set of encoders) regardless of the number of RBs assigned to the user. In this scenario, the MCS exclusion testing may be based on the total $N_{DBPS}$ from all RBs assigned to the user. Even though total $N_{DBPS}$ is an integer due to the summation of integer numbers, $N_{ES}$ that is calculated based on total $N_{DPBS}$ will be larger than each $N_{ES,k}$ (a number of encoders assigned to each RB), which could cause $$\frac{N_{DBPS}}{N_{ES}}$$

to be a non-integer and thus fail the MCS exclusion test.

As such, enabling uneven bit distribution for multiple encoder parsing is advantageous because it provides greater flexibility regarding MCS index selection. A greater variety of MCS indices may be supported by enabling uneven bit distribution as compared to an even bit distribution requirement for multiple encoder parsing.

Figure 2:
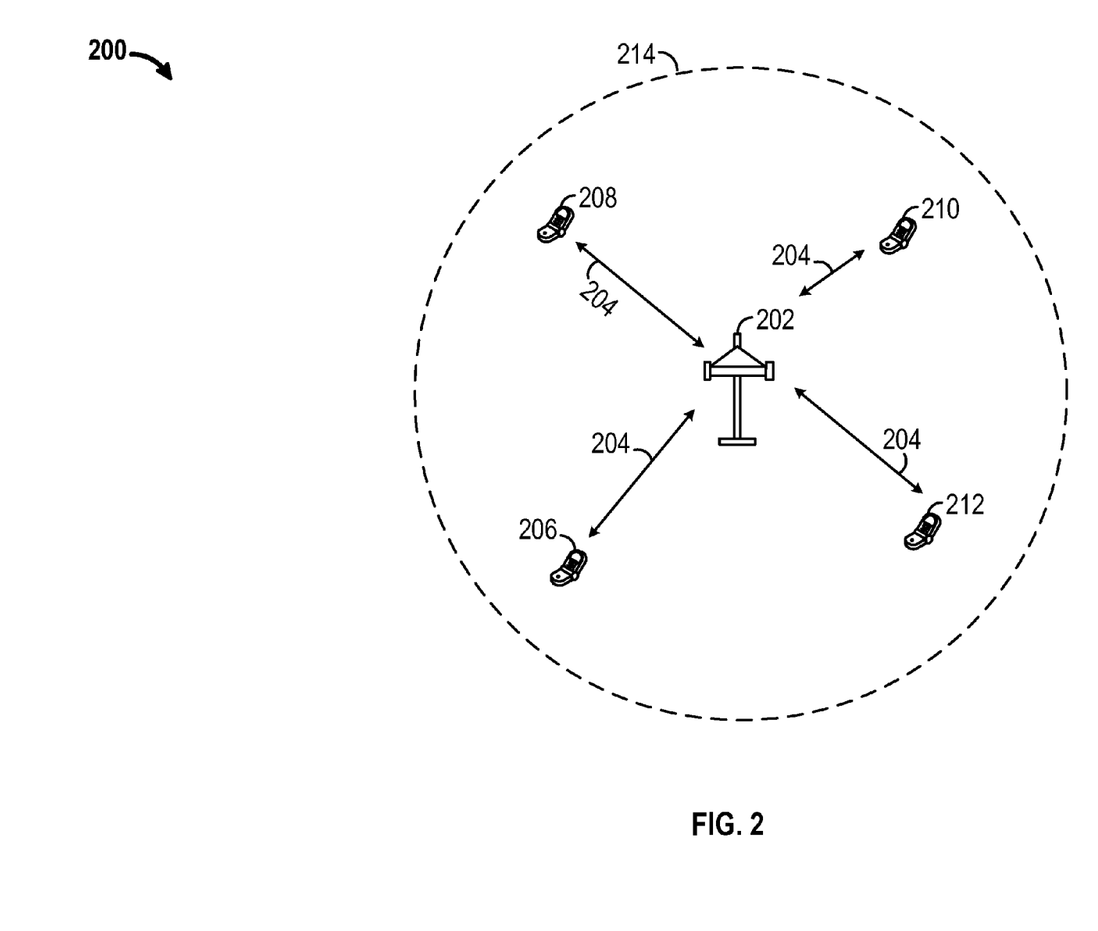
FIG. 2 is a diagram of a wireless network (e.g., a Wi-Fi network) with wireless devices supporting uneven bit distribution for encoder parsing.

FIG. 2 is a diagram 200 of a wireless network (e.g., a Wi-Fi network) with wireless devices supporting uneven bit distribution for encoder parsing. The diagram 200 illustrates an AP 202 broadcasting/transmitting within a service area 214. STAs 206, 208, 210, 212 are within the service area 214 of the AP 202 (although only 4 STAs are shown in FIG. 2, more or less STAs may be within the service area 214).

The AP 202 may transmit a frame (e.g., data symbols) 204 to one or more STAs (e.g., STAs 206, 208, 210, 212) and vice versa. A frame may include a preamble and data symbols. The preamble may be considered a header of the frame with information identifying a modulation and coding scheme, a transmission rate, and a length of time to transmit the frame. The preamble may include a signal (SIG) field, a short training field (STF), and a long training field (LTF) (e.g., having one or more LTF symbols). The SIG field may include transfer rate and length information. The STF may be used to improve automatic gain control (AGC) in a multi-transmit and multi-receive system. The LTF symbols may be used to provide the information used by a receiver (e.g., the STA 206) to perform channel estimation. The number of LTF symbols may be equal to or greater than the number of space-time streams from different STAs. For example, if there are 4 STAs, there may be 4 LTF symbols within the preamble. The data symbols may contain the user data to be communicated between the STA 206, for example, and the AP 202.

In an aspect, the STA 206 may have data bits to transmit to the AP 202 in one or more OFDM symbols in a data field of the frame 204. The data bits may be encoded by one or more encoders (e.g., BCC encoders) for transmission. In an aspect, the STA 206, for example, may use multiple BCC encoders to encode data bits for transmission to the AP 202 without having to evenly distribute the data bits among the BCC encoders. To do so, the STA 206 may first determine a number of OFDM data symbols in the data field using Eq. 4:

$$N_{sym} = m_{STBC} \times \left\lceil \frac{8 \times length + N_{service} + N_{tail} \times N_{ES}}{m_{STBC} \times N_{DBPS}} \right\rceil$$

In Eq. 4, length represents the value of the length field in octets in the SIG field or an aggregated medium access control (MAC) protocol data unit (A-MPDU) length prior to end-of-frame MAC padding, $m_{stbc}$ represents a space-time block code (STBC) value ($m_{stbc}=2$ if STBC is used, and $m_{stbc}=1$ if STBC is not used). $N_{DBPS}$ is the number of data bits per OFDM symbol, $N_{tail}$ is a number of tail bits per encoder (e.g., 6 tail bits such as 6 zeroes for each encoder). $N_{SERVICE}$ may be 16 bits, and $N_{ES}$ represents the number of encoders to be used for encoding the data bits for transmission. The symbol $\lceil x \rceil$ is ceiling function that denotes the smallest integer greater than or equal to x.

In an aspect, for OFDMA transmission, $N_{DBPS}$ may be determined using Eq. 5:

$$N_{DBPS} = \sum_{k=1}^{N_{RB}} N_{DBPS,k}$$

In Eq. 5, $N_{RB}$ represents the total number of resource blocks allocated to the STA 206, the $N_{DBPS,k}$ represents the number of data bits per symbol for each allocated resource block. Next, assuming $N_{ES}$ encoders, one may further assume that $encoder_1, \ldots, encoder_{Nes-1}$ do not need any MAC and physical layer padding bits. For encoder i, i= 1, ..., $N_{es}-1$, the number of distributed data bits to be distributed to each encoder (except for a last encoder, in which $N_{es}-1$ represents the second to the last encoder) in a set of encoders, after scrambling, may be given based on the data rate that each encoder can support and may be determined by Eq. 6:

$$N_{pld,i} = N_{sym} \times N_{bpscs} \times R \times \left\lfloor \frac{EncoderDataRate \times T_{sym}}{N_{bpscs} \times R} \right\rfloor - N_{tail}$$

In Eq. 6, $T_{sym}$ represents a data symbol duration. The symbol $\lfloor x \rfloor$ denotes a floor function that denotes the smallest integer less than or equal to x. In Eq. 6, EncoderDataRate× $T_{sym}$ may represent the maximum number of data bits per symbol, $N_{DBPS}$, and the floor function may determine the maximum number of data tones supported by the encoder i given a particular MCS setting. The expression $$\left\lfloor \frac{EncoderDataRate \times T_{sym}}{N_{bpscs} \times R} \right\rfloor$$

may represent the maximum number of data tones that may be supported by an encoder given an MCS code rate, and the expression $$N_{bpscs} \times R \times \left\lfloor \frac{EncoderDataRate \times T_{sym}}{N_{bpscs} \times R} \right\rfloor$$

may represent the number of data bits per symbol for one encoder. The tail bits may be appended to the data bit flow after the encoder parser operation.

Having determined the number of scrambled bits, $N_{pld,i}$, to distribute to each encoder in the set of encoders except for the last encoder, the number of scrambled bits to distribute to the last encoder may be determined by Eq. 7:

$$N_{pld,N_{ES}} = N_{sym} \times N_{DBPS} - N_{tail} \times N_{ES} -$$
$$(N_{ES} - 1) \times \left( N_{sym} \times N_{bpscs} \times R \times \left\lfloor \frac{EncoderDataRate \times T_{sym}}{N_{bpscs} \times R} \right\rfloor - N_{tail} \right)$$

Eq. 7 may be simplified to Eq. 8:

$$N_{pld,N_{ES}} = N_{sym} \times N_{DBPS} - (N_{ES}-1) \times \left( N_{sym} \times N_{bpscs} \times R \times \left\lfloor \frac{EncoderDataRate \times T_{sym}}{N_{bpscs} \times R} \right\rfloor \right) - N_{tail}$$

As such, the last encoder may not have the same number of bits allocated as the other encoders. In Eq. 8, $N_{sym} \times N_{DBPS}$ may indicate a total number of data bits. The expression, $$(N_{ES}-1) \times \left( N_{sym} \times N_{bpscs} \times R \times \left\lfloor \frac{EncoderDataRate \times T_{sym}}{N_{bpscs} \times R} \right\rfloor \right),$$

may indicate the number of data bits allocated to $N_{ES}-1$ encoders. Again, tail bits may be appended to the data bits after the encoder parse. In uneven bit distribution encoder parsing, the MCS exclusion test may only require that the total $N_{DBPS}$ is an integer. If $N_{DBPS}$ is an integer, then the particular MCS index may be used, otherwise if $N_{DBPS}$ is a non-integer the particular MCS index is excluded.

Having determined the bit distribution for each encoder in the set of encoders the STA 206 may transmit the data to the AP 202. In an aspect, the data is encoded based on the first number of bits distributed to the first (or the subset) $N_{ES}-1$ encoders and on the second number of bits distributed to the $N_{ES}$th encoder.

Although the aforementioned example has been discussed with a STA transmitting to an AP, the same operations and procedures for supporting uneven bit distribution to encoders may be applied by an AP transmitting data bits to a STA.

Figure 3:
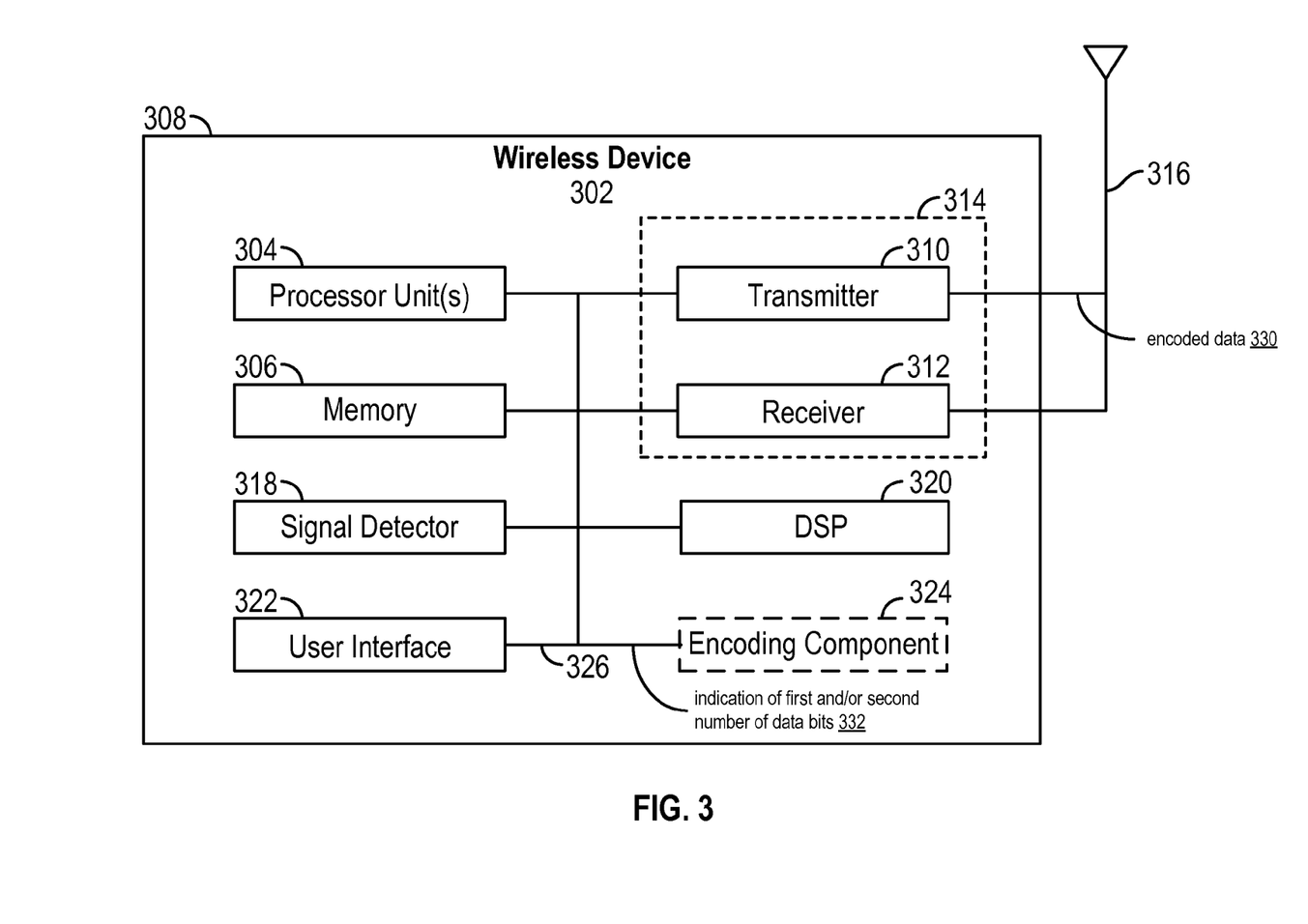
FIG. 3 is a functional block diagram of a wireless device that supports uneven bit distribution within the wireless communication system of FIG. 1.

FIG. 3 is a functional block diagram of a wireless device 302 that supports uneven bit distribution within the wireless communication system 100 of FIG. 1. The wireless device 302 is an example of a device that may be configured to implement the various methods described herein. For example, the wireless device 302 may be the AP 104, the AP 202, the STAs 112, 114, 116, 118, or the STAs 206, 208, 210, 212.

The wireless device 302 may include a processor 304 which controls operation of the wireless device 302. The processor 304 may also be referred to as a central processing unit (CPU). Memory 306, which may include both read-only memory (ROM) and random access memory (RAM), may provide instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable (by the processor 304, for example) to implement the methods described herein.

The processor 304 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 302 may also include a housing 308, and the wireless device 302 may include a transmitter 310 and/or a receiver 312 to allow transmission and reception of data between the wireless device 302 and a remote device. The transmitter 310 and the receiver 312 may be combined into a transceiver 314. An antenna 316 may be attached to the housing 308 and electrically coupled to the transceiver 314. The wireless device 302 may also include multiple transmitters, multiple receivers, multiple transceivers, and/or multiple antennas.

The wireless device 302 may also include a signal detector 318 that may be used to detect and quantify the level of signals received by the transceiver 314 or the receiver 312. The signal detector 318 may detect such signals as total energy, energy per subcarrier per symbol, power spectral density, and other signals. The wireless device 302 may also include a digital signal processor (DSP) 320 for use in processing signals. The DSP 320 may be configured to generate a packet for transmission. In some aspects, the packet may comprise a physical layer convergence procedure (PLCP) protocol data unit (PPDU).

The wireless device 302 may further comprise a user interface 322 in some aspects. The user interface 322 may comprise a keypad, a microphone, a speaker, and/or a display. The user interface 322 may include any element or component that conveys information to a user of the wireless device 302 and/or receives input from the user.

When the wireless device 302 is implemented as an AP (e.g., AP 104, AP 202) or as a STA (e.g., the STA 114, the STA 206), the wireless device 302 may also comprise an encoding component 324. The encoding component 324 may be configured to determine a number of symbols in a data field. The encoding component 324 may be configured to distribute a first number of data bits to each encoder in a subset of encoders in a set of encoders based on the determined number of symbols. The encoding component 324 may be configured to distribute a second number of data bits to a last encoder in the set of encoders based on the determined number of symbols. In an aspect, the encoding component 324 may indicate 332 the first and/or the second number of data bits to be distributed to the processor 304, for example. The encoding component 324 may be configured to transmit data (e.g., encoded data 330) to a second wireless device, in which the data is encoded based on the distributed first number of data bits to each encoder in the subset of encoders and the distributed second number of data bits to the last encoder in the set of encoders. In one configuration, the number of symbols may be determined based on a total number of resource blocks allocated to the wireless device. In another configuration, the encoding component 324 may be configured to distribute the first number of data bits by determining the first number of data bits to distribute to each encoder in the subset of encoders and providing the first number of data bits to each encoder in the subset of encoders. In another configuration, the first number of data bits may be determined based on at least one of a data rate per encoder, a number of bits per single subcarrier, a data symbol duration, or a modulation and coding scheme rate. In another configuration, the encoding component 324 may be configured to distribute the second number of data bits by determining the second number of data bits to distribute to the last encoder in the set of encoders and providing the second number of data bits to the last encoder in the set of encoders. In another configuration, the encoding component 324 may be configured to determine the second number of data bits by determining a total number of data bits, by determining a total number of payload bits distributed to the subset of encoders, by determining a first number of tail bits, and by subtracting the determined total number of payload bits, the first number of tail bits, and a second number of tail bits from the total number of data bits.

The various components of the wireless device 302 may be coupled together by a bus system 326. The bus system 326 may include a data bus, for example, as well as a power bus, a control signal bus, and a status signal bus in addition to the data bus. Components of the wireless device 302 may be coupled together or accept or provide inputs to each other using some other mechanism.

Although a number of separate components are illustrated in FIG. 3, one or more of the components may be combined or commonly implemented. For example, the processor 304 may be used to implement not only the functionality described above with respect to the processor 304, but also to implement the functionality described above with respect to the signal detector 318, the DSP 320, the user interface 322, and/or the encoding component 324. Further, each of the components illustrated in FIG. 3 may be implemented using a plurality of separate elements.

Figure 4:
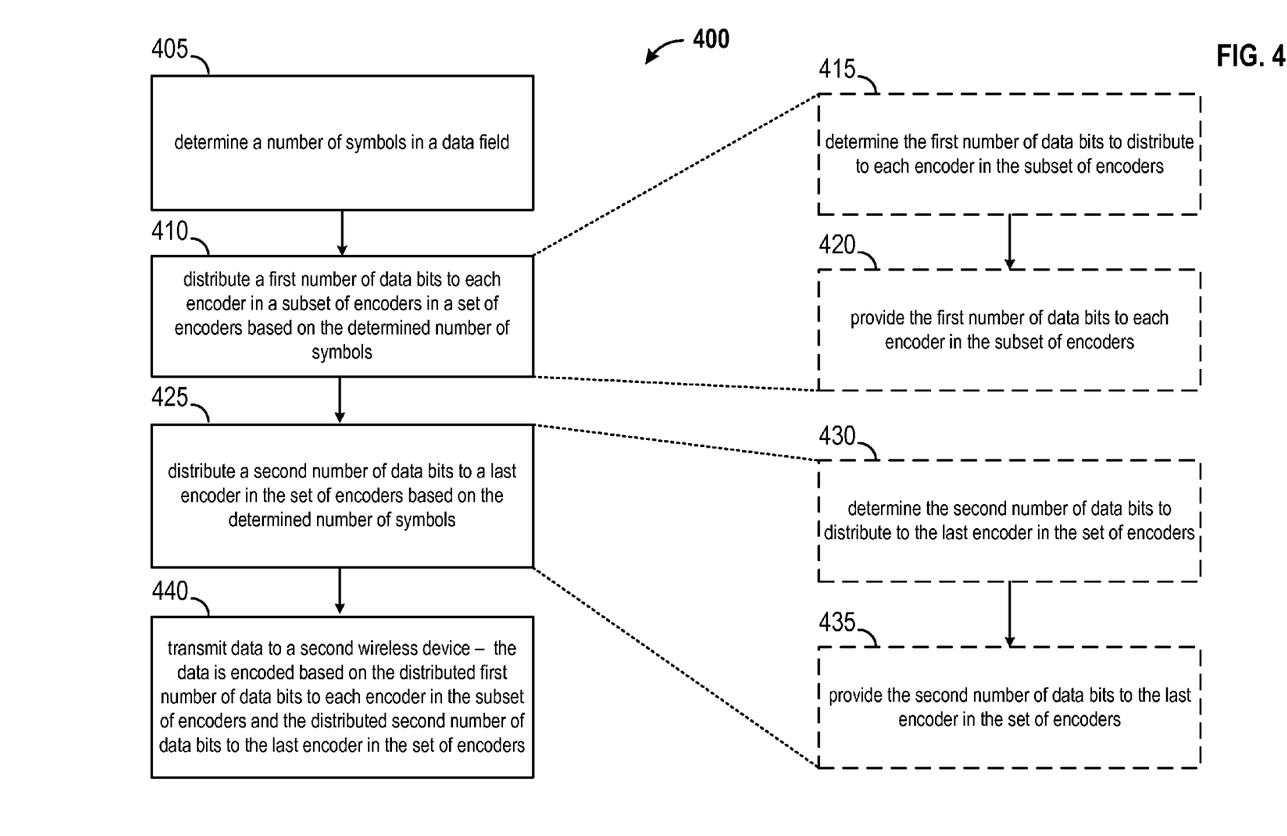
FIG. 4 is a flowchart of an exemplary method of wireless communication supporting uneven bit distribution for encoder parsing.

FIG. 4 is a flowchart of an exemplary method 400 of wireless communication supporting uneven bit distribution for encoder parsing. The method 400 may be performed using an apparatus (e.g., the AP 104, the AP 202, the STA 114, the STA 206, or the wireless device 302, for example). Although the method 400 is described below with respect to the elements of wireless device 302 of FIG. 3, other components may be used to implement one or more of the steps described herein. In FIG. 4, any blocks indicated with dotted lines represent optional operations.

At block 405, the apparatus may determine a number of symbols in a data field. In an aspect, the number of symbols may be determined based on a total number of resource blocks allocated to the apparatus. For example, referring to FIG. 2, the STA 206 may determine a number of symbols in a data field. The STA 206 may determine the number of data symbols in the data field according to Eq. 4.

At block 410, the apparatus may distribute a first number of data bits to each encoder in a subset of encoders in a set of encoders based on the determined number of symbols. The apparatus may distribute the first number of data bits to each encoder by determining the first number of data bits to distribute to each encoder in the subset of encoders (at block 415) and by providing the first number of data bits to each encoder in the subset of encoders (at block 420). For example, referring to FIG. 2, the STA 206 may distribute the first number of data bits to each encoder in a subset of 4 encoders in a set of 5 encoders based on the determined number of symbols. The STA 206 may determine the first number of data bits to distribute to each of the 4 encoders according to Eq. 6, and the STA 206 may provide the first number of data bits to the 4 encoders.

At block 425, the apparatus may distribute a second number of data bits to a last encoder in the set of encoders based on the determined number of symbols. The apparatus may distribute the second number of data bits by determining the second number of data bits to distribute to the last encoder in the set of encoders (at block 430) and by providing the second number of data bits to the last encoder in the set of encoders (at block 435). For example, referring to FIG. 2, the STA 206 may distribute the second number of data bits (e.g., the remaining data bits) to the $5^{th}$ encoder in the set of 5 encoders based on the determined number of symbols. The STA 206 may determine the second number of data bits to distribute to the $5^{th}$ encoder based on Eqs. 7 or 8 and may provide the second number of data bits to the $5^{th}$ encoder.

At block 440, the apparatus may transmit data to a second wireless device. The data may be encoded based on the distributed first number of data bits to each encoder in the subset of encoders and the distributed second number of data bits to the last encoder in the set of encoders. For example, referring to FIG. 2, the STA 206 may transmit data to the AP 202. The data may be encoded based on the distributed first and second number of data bits distributed to the various encoders.

Figure 5:
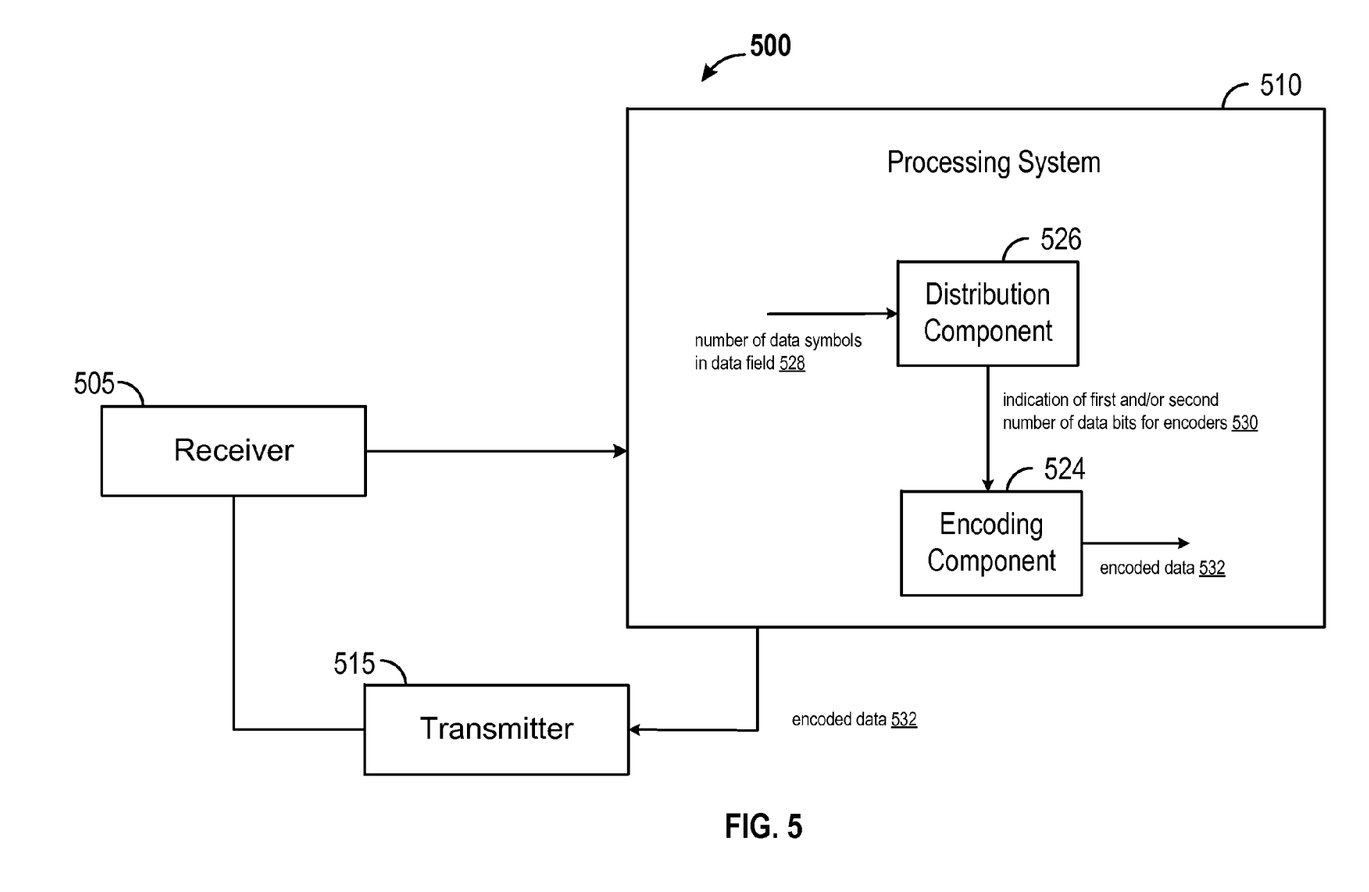
FIG. 5 is a functional block diagram of an exemplary wireless communication device supporting uneven bit distribution for encoder parsing.

FIG. 5 is a functional block diagram of an exemplary wireless communication device 500 supporting uneven bit distribution for encoder parsing. The wireless communication device 500 may include a receiver 505, a processing system 510, and a transmitter 515. The processing system 510 may include an encoding component 524 and/or a distribution component 526. The processing system 510 and/or the encoding component 524 may be configured to determine a number of symbols in a data field. In an aspect, the distribution component 526 may be informed of a number of data symbols in a data field 528 and provide an indication 530 of a first and/or second number of data bits to be distributed to various encoders. The processing system 510, the encoding component 524, and/or the distribution component 526 may be configured to distribute a first number of data bits to each encoder in a subset of encoders in a set of encoders based on the determined number of symbols. The processing system 510, the encoding component 524, and/or the distribution component 526 may be configured to distribute a second number of data bits to a last encoder in the set of encoders based on the determined number of symbols. The processing system 510, the encoding component 524, and/or the transmitter 515 may be configured to transmit data (e.g., encoded data 532) to a second wireless device. The data may be encoded (e.g., by the encoding component 524) based on the distributed first number of data bits to each encoder in the subset of encoders and the distributed second number of data bits to the last encoder in the set of encoders. In an aspect, the number of symbols may be determined based on a total number of resource blocks allocated to the wireless device. In one configuration, the processing system 510, the encoding component 524, and/or the distribution component 526 may be configured to distribute a first number of data bits by determining the first number of data bits to distribute to each encoder in the subset of encoders and by providing the first number of data bits to each encoder in the subset of encoders. In an aspect, the first number of data bits is determined based on at least one of a data rate per encoder, a number of bits per single subcarrier, a data symbol duration, or a modulation and coding scheme rate. In another configuration, the processing system 510, the encoding component 524, and/or the distribution component 526 may be configured to distribute the second number of data bits by determining the second number of data bits to distribute to the last encoder in the set of encoders and by providing the second number of data bits to the last encoder in the set of encoders. In another configuration, the processing system 510, the encoding component 524, and/or the distribution component 526 may be configured to determine the second number of data bits by determining a total number of data bits, by determining a total number of payload bits distributed to the subset of encoders, by determining a first number of tail bits, and by subtracting the determined total number of payload bits, the first number of tail bits, and a second number of tail bits from the total number of data bits.

The receiver 505, the processing system 510, the encoding component 524, and/or the transmitter 515 may be configured to perform one or more functions discussed above with respect to blocks 405, 410, 415, 420, 425, 430, 435, and 440 of FIG. 4. The receiver 505 may correspond to the receiver 312. The processing system 510 may correspond to the processor 304. The transmitter 515 may correspond to the transmitter 310. The encoding component 524 may correspond to the encoding components 124, 126 and/or the encoding component 324.

In one configuration, the wireless communication device 500 may include means for determining a number of symbols in a data field. The wireless communication device 500 may include means for distributing a first number of data bits to each encoder in a subset of encoders in a set of encoders based on the determined number of symbols. The wireless communication device 500 may include means for distributing a second number of data bits to a last encoder in the set of encoders based on the determined number of symbols. The wireless communication device 500 may include means for transmitting data to a second wireless device. The data may be encoded based on the distributed first number of data bits to each encoder in the subset of encoders and the distributed second number of data bits to the last encoder in the set of encoders. In an aspect, the number of symbols may be determined based on a total number of resource blocks allocated to the wireless device. In another configuration, the means for distributing the first number of data bits may be configured to determine the first number of data bits to distribute to each encoder in the subset of encoders and to provide the first number of data bits to each encoder in the subset of encoders. In another aspect, the first number of data bits may be determined based on at least one of a data rate per encoder, a number of bits per single subcarrier, a data symbol duration, or a modulation and coding scheme rate. In another configuration, the means for distributing the second number of data bits may be configured to determine the second number of data bits to distribute to the last encoder in the set of encoders and to provide the second number of data bits to the last encoder in the set of encoders. In another configuration, means for distributing the second number of data bits is configured to determine a total number of data bits, to determine a total number of payload bits distributed to the subset of encoders, to determine a first number of tail bits, and to subtract the determined total number of payload bits, the first number of tail bits, and a second number of tail bits from the total number of data bits. In another aspect, an uneven number of bits may be distributed within the set of encoders for transmitting the data in a WLAN. In another aspect, the first number of data bits distributed to each encoder in the subset of encoders and the second number of data bits distributed to the last encoder are different. In another aspect, the data may be transmitted using an MCS rate that results in an integer number of data bits per symbol.

For example, means for determining a number of symbols in a data field may comprise the processing system 510, the encoding component 524, and/or the distribution component 526. Means for distributing a first number of data bits to each encoder in a subset of encoders in a set of encoders based on the determined number of symbols may comprise the processing system 510, the encoding component 524, and/or the distribution component 526. Means for distributing a second number of data bits to a last encoder in the set of encoders based on the determined number of symbols may comprise the processing system 510, the encoding component 524, and/or the distribution component 526. Means for transmitting data to a second wireless device, in which the data is encoded based on the distributed first number of data bits to each encoder in the subset of encoders and the distributed second number of data bits to the last encoder in the set of encoders may comprise the processing system 510, the encoding component 524, and/or the transmitter 515.

Figure 6:
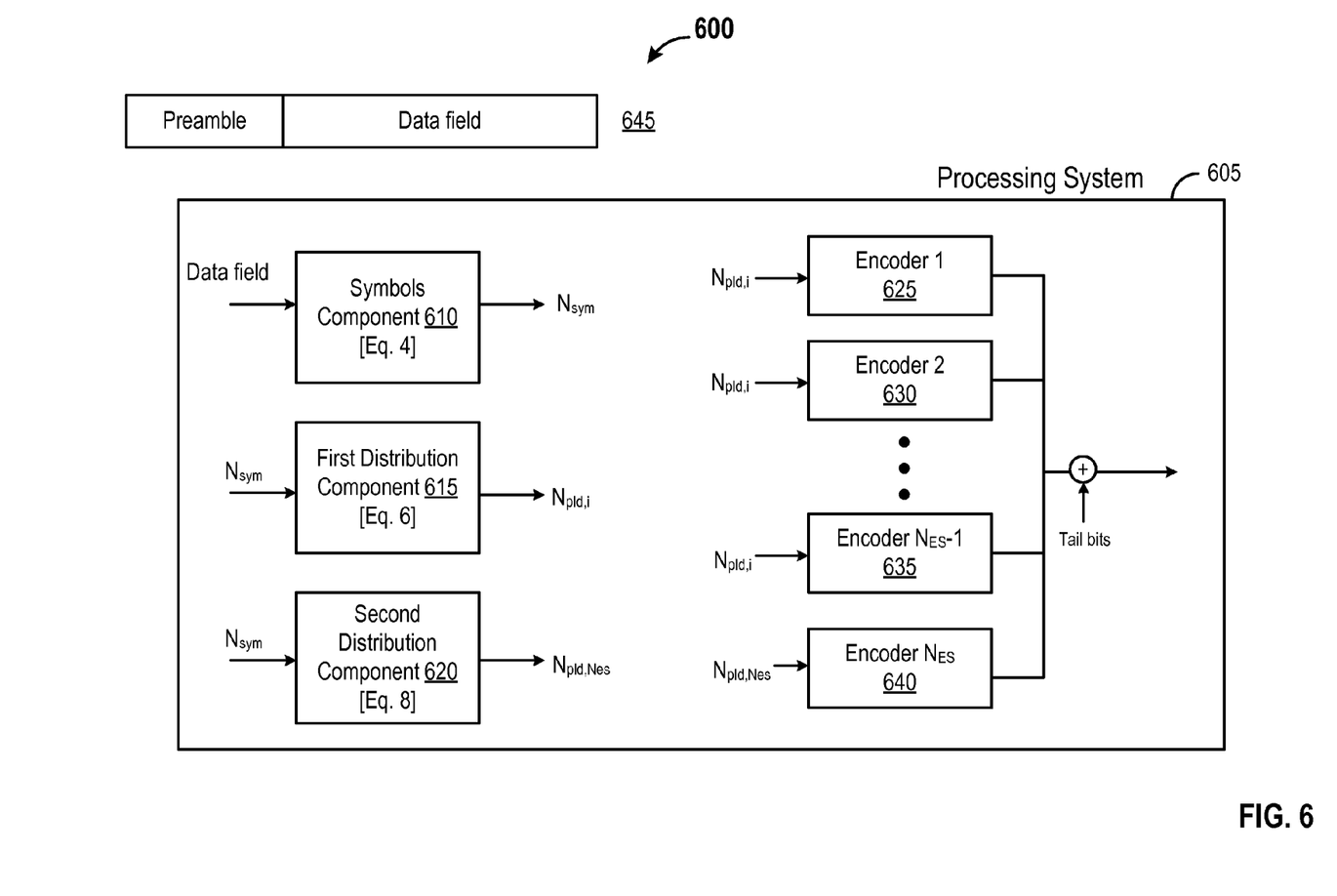
FIG. 6 is a block diagram of an exemplary wireless communication device supporting uneven bit distribution for encoder parsing.

FIG. 6 is a block diagram of an exemplary wireless communication device 600 supporting uneven bit distribution for encoder parsing. The wireless communication device 600 may include a processing system 605, which may be similar to the processing system 510 in FIG. 5. The processing system 605 may include a symbols component 610, a first distribution component 615, a second distribution component 620, and a plurality of encoders such as a first encoder 625, a second encoder 630, an $N_{ES-1}$th encoder 635, and an $N_{ES}$th encoder 640. In an aspect, the plurality of encoders may be BCC encoders.

Referring to FIG. 6, a frame 645 may include a preamble and a data field. The symbols component 610 may be configured to calculate a number of symbols in the data field, $N_{sym}$, based on Eq. 4 as discussed above. Based on the calculated number of data symbols, the first distribution component 615 may be configured to determine a first number of data bits, $N_{pld,i}$, based on Eq. 6, to distribute to each of the first encoder 625, the second encoder 630, and the $N_{ES-1}$th encoder 635. Similarly, based on the calculated number of data symbols in the data field, the second distribution component 620 may be configured to determine a second number of data bits, $N_{pld,Nes}$, based on Eqs. 7 or 8, to distribute to the $N_{ES}$th encoder 640, which may be the last encoder of the plurality of encoders. In an aspect, the bits may be unevenly distributed. That is, the first, second, and $N_{ES-1}$th encoders 625, 630, 635 may receive the same number of bits, but the $N_{ES}$th encoder 640 may receive a different number of bits than the other encoders. Tail bits may be appended to the data bits after encoder parsing by the plurality of encoders.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, components and circuits described in connection with the present disclosure may be implemented or performed with a general purpose processor, a DSP, an application specific integrated circuit (ASIC), an FPGA or other PLD, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, compact disc (CD) ROM (CD-ROM) or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, digital versatile disc (DVD), floppy disk and blu-ray disc where disks usually reproduce data magnetically, while discs reproduce data optically with lasers. Thus, computer-readable medium comprises a non-transitory computer readable medium (e.g., tangible media).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Further, it should be appreciated that components and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims. The various figures may depict elements with dotted lines. In some instances, elements depicted with dotted lines may be considered optional features.

While the foregoing is directed to aspects of the present disclosure, other and further aspects of the disclosure may be devised without departing from the basic scope thereof, and the scope thereof is determined by the claims that follow.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

What is claimed is:

1. A method of wireless communication by a wireless device, comprising:
   determining a total number of symbols for encoding a plurality of data bits in a data field of a frame to be transmitted;
   unevenly distributing the plurality of data bits to a set of encoders, wherein unevenly distributing the plurality of data bits to the set of encoders comprises:
      distributing a first number of data bits of the plurality of data bits to each encoder in a subset of one or more encoders in the set of encoders based on the total number of symbols, wherein the set of encoders includes N encoders where N is an integer greater than 1, and wherein the subset of one or more encoders includes N−1 encoder(s) such that the subset of one or more encoders excludes one encoder of the N encoders; and
      distributing a second number of data bits of the plurality of data bits to the one encoder excluded from the subset of one or more encoders based on the total number of symbols, wherein the first number of data bits is different from the second number of data bits;
   encoding, by each encoder in the subset of one or more encoders, the first number of data bits without padding the first number of data bits to generate a first plurality of symbols of the total number of symbols;
   padding and then encoding, by the one encoder excluded from the subset of one or more encoders, the second number of data bits to generate a second plurality of symbols of the total number of symbols; and
   transmitting the frame including the data field, wherein the data field includes the first plurality of symbols of the total number of symbols and the second plurality of symbols of the total number of symbols.

2. The method of claim 1, wherein determining the total number of symbols comprises determining the total number of symbols based on a total number of resource blocks allocated to the wireless device.

3. The method of claim 1, wherein distributing the first number of data bits comprises:
    determining the first number of data bits to distribute to each encoder in the subset of one or more encoders; and
    providing the first number of data bits to each encoder in the subset of one or more encoders.

4. The method of claim 3, wherein determining the first number of data bits comprises determining the first number of data bits based on at least one of: a data rate per encoder, a number of bits per single subcarrier, a data symbol duration, or a modulation and coding scheme rate.

5. The method of claim 1, wherein distributing the second number of data bits comprises:
    determining the second number of data bits to distribute to the one encoder excluded from the subset of one or more encoders; and
    providing the second number of data bits to the one encoder excluded from the subset of one or more encoders.

6. The method of claim 5, wherein determining the second number of data bits comprises:
    determining a total number of the plurality of data bits to be encoded;
    determining a total number of the plurality of data bits distributed to the subset of one or more encoders;
    determining a first number of tail bits; and
    subtracting the determined total number of the plurality of data bits distributed to the subset of one or more encoders, the first number of tail bits, and a second number of tail bits from the total number of the plurality of data bits to be encoded.

7. The method of claim 1, wherein the frame is transmitted using a modulation and coding scheme (MCS) rate that results in an integer number of data bits per symbol.

8. An apparatus, comprising:
    a plurality of encoders including a first encoder, a second encoder, and a third encoder; and
    at least one processor coupled to the plurality of encoders, wherein the at least one processor is configured to:
        determine a total number of symbols for encoding a plurality of data bits in a data field of a frame to be transmitted;
        unevenly distribute the plurality of data bits to the plurality of encoders, wherein to unevenly distribute the plurality of data bits to the plurality of encoders, the at least one processor is configured to:
            distribute a first number of data bits of the plurality of data bits to the first encoder based on the total number of symbols, wherein the first encoder is configured to encode the first number of data bits without padding the first number of data bits to generate a first plurality of symbols of the total number of symbols;
            distribute the first number of data bits to the second encoder of the plurality of encoders based on the total number of symbols, wherein the second encoder is configured to encode the first number of data bits without padding the first number of data bits to generate a second plurality of symbols of the total number of symbols; and
            distribute a second number of data bits of the plurality of data bits to only the third encoder of the plurality of encoders based on the total number of symbols, wherein the third encoder is configured to pad and then encode the second number of data bits to generate a third plurality of symbols of the total number of symbols, wherein the first number of data bits is different from the second number of data bits; and
        transmit the frame including the data field, wherein the data field includes the first plurality of symbols of the total number of symbols, the second plurality of symbols of the total number of symbols, and the third plurality of symbols of the total number of symbols.

9. The apparatus of claim 8, wherein to determine the total number of symbols, the at least one processor is configured to determine the total number of symbols based on a total number of resource blocks allocated to the apparatus.

10. The apparatus of claim 8, wherein to distribute the first number of data bits to the first encoder and the second encoder, the at least one processor is configured to:
    determine the first number of data bits to distribute to the first encoder and the second encoder; and
    provide the first number of data bits to the first encoder and the second encoder.

11. The apparatus of claim 10, wherein to determine the first number of data bits, the at least one processor is configured to determine the first number of data bits based on at least one of: a data rate per encoder, a number of bits per single subcarrier, a data symbol duration, or a modulation and coding scheme rate.

12. The apparatus of claim 8, wherein to distribute the second number of data bits to only the third encoder, the at least one processor is configured to:
    determine the second number of data bits to distribute to only the third encoder; and
    provide the second number of data bits to only the third encoder.

13. The apparatus of claim 12, wherein to determine the second number of data bits, the at least one processor is configured to:
    determine a total number of the plurality of data bits to be encoded;
    determine a total number of the plurality of data bits distributed to the first encoder and the second encoder;
    determine a first number of tail bits; and
    subtract the total number of the plurality of data bits distributed to the first encoder and the second encoder, the first number of tail bits, and a second number of tail bits from the total number of the plurality of data bits to be encoded.

14. An apparatus, comprising:
    a set of encoders including N encoders where N is an integer greater than 1; and
    at least one processor coupled to the set of encoders, wherein the at least one processor is configured to:
        determine a total number of symbols for encoding a plurality of data bits in a data field of a frame to be transmitted;
        unevenly distribute the plurality of data bits to the set of encoders, wherein to unevenly distribute the plurality of data bits to the set of encoders, the at least one processor is configured to:
            distribute a first number of data bits of the plurality of data bits to each encoder in a subset of one or more encoders in the set of encoders based on the total number of symbols, wherein the subset of one or more encoders includes N−1 encoder(s) such that the subset of one or more encoders excludes one encoder of the N encoders, and wherein each encoder in the subset of one or more encoders is configured to encode the first number of data bits without padding the first number of data bits to generate a first plurality of symbols of the total number of symbols; and distribute a second number of data bits of the plurality of data bits to the one encoder excluded from the subset of one or more encoders based on the total number of symbols, wherein the one encoder excluded from the subset of one or more encoders is configured to pad and then encode the second number of data bits to generate a second plurality of symbols of the total number of symbols, wherein the first number of data bits is different from the second number of data bits; and transmit the frame including the data field, wherein the data field includes the first plurality of symbols of the total number of symbols and the second plurality of symbols of the total number of symbols.

15. The apparatus of claim 14, wherein to determine the total number of symbols, the at least one processor is configured to determine the total number of symbols based on a total number of resource blocks allocated to the apparatus.

16. The apparatus of claim 14, wherein to distribute the first number of data bits, the at least one processor is configured to:
determine the first number of data bits to distribute to each encoder in the subset of one or more encoders; and
provide the first number of data bits to each encoder in the subset of one or more encoders.

17. The apparatus of claim 16, wherein to determine the first number of data bits, the at least one processor is configured to determine the first number of data bits based on at least one of: a data rate per encoder, a number of bits per single subcarrier, a data symbol duration, or a modulation and coding scheme rate.

18. The apparatus of claim 14, wherein to distribute the second number of data bits, the at least one processor is configured to:
determine the second number of data bits to distribute to the one encoder excluded from the subset of one or more encoders; and
provide the second number of data bits to the one encoder excluded from the subset of one or more encoders.

19. The apparatus of claim 18, wherein to determine the second number of data bits, the at least one processor is configured to:
determine a total number of the plurality of data bits to be encoded;
determine a total number of the plurality of data bits distributed to the subset of one or more encoders;
determine a first number of tail bits; and
subtract the determined total number of the plurality of data bits distributed to the subset of one or more encoders, the first number of tail bits, and a second number of tail bits from the total number of the plurality of data bits to be encoded.

20. The apparatus of claim 14, wherein the frame is transmitted using a modulation and coding scheme (MCS) rate that results in an integer number of data bits per symbol.

21. A non-transitory computer-readable medium having code stored thereon that, when executed, causes at least one processor of a wireless device to:
determine a total number of symbols for encoding a plurality of data bits in a data field of a frame to be transmitted;
unevenly distribute the plurality of data bits to a set of encoders, wherein the code that, when executed, causes the at least one processor to unevenly distribute the plurality of data bits to the set of encoders causes the at least one processor to:
distribute a first number of data bits of the plurality of data bits to each encoder in a subset of one or more encoders in the set of encoders based on the total number of symbols, wherein the set of encoders includes N encoders where N is an integer greater than 1, wherein the subset of one or more encoders includes N−1 encoder(s) such that the subset of one or more encoders excludes one encoder of the N encoders, and wherein each encoder in the subset of one or more encoders is configured to encode the first number of data bits without padding the first number of data bits to generate a first plurality of symbols of the total number of symbols; and distribute a second number of data bits of the plurality of data bits to the one encoder excluded from the subset of one or more encoders based on the total number of symbols, wherein the one encoder excluded from the subset of one or more encoders is configured to pad and then encode the second number of data bits to generate a second plurality of symbols of the total number of symbols, wherein the first number of data bits is different from the second number of data bits; and transmit the frame including the data field, wherein the data field includes the first plurality of symbols of the total number of symbols and the second plurality of symbols of the total number of symbols.

22. The non-transitory computer-readable medium of claim 21, wherein the number of symbols is determined based on a total number of resource blocks allocated to the wireless device.

23. The non-transitory computer-readable medium of claim 21, wherein the code that, when executed, causes the at least one processor to distribute the first number of data bits includes code that, when executed, causes the at least one processor to:
determine the first number of data bits to distribute to each encoder in the subset of one or more encoders; and
provide the first number of data bits to each encoder in the subset of one or more encoders.

24. The non-transitory computer-readable medium of claim 23, wherein the first number of data bits is determined based on at least one of: a data rate per encoder, a number of bits per single subcarrier, a data symbol duration, or a modulation and coding scheme rate.

25. The non-transitory computer-readable medium of claim 21, wherein the code that, when executed, causes the at least one processor to distribute the second number of data bits includes code that, when executed, causes the at least one processor to:
determine the second number of data bits to distribute to the one encoder excluded from the subset of one or more encoders; and
provide the second number of data bits to the one encoder excluded from the subset of one or more encoders.

26. The non-transitory computer-readable medium of claim 25, wherein the code that, when executed, causes the at least one processor to determine the second number of data bits includes code that, when executed, causes the at least one processor to:
determine a total number of the plurality of data bits to be encoded;
determine a total number of the plurality of data bits distributed to the subset of one or more encoders;

determine a first number of tail bits; and
subtract the determined total number of the plurality of data bits distributed to the subset of one or more encoders, the first number of tail bits, and a second number of tail bits from the total number of the plurality of data bits to be encoded.

\* \* \* \* \*